(12) United States Patent
Yamashita (10) Patent No.: US 6,407,631 B2
(45) Date of Patent: Jun. 18, 2002

(54) CHARGE-TYPE SENSOR AMPLIFYING CIRCUIT

(75) Inventor: Muneharu Yamashita, Toyama-ken (JP)

(73) Assignee: Murata Manufacturing, Co., Ltd. (JP)

( * ) Notice: Subject to any disclaimer, the term of this patent is extended or adjusted under 35 U.S.C. 154(b) by 0 days.

(21) Appl. No.: 09/842,738

(22) Filed: Apr. 25, 2001

(30) Foreign Application Priority Data

Apr. 25, 2000 (JP) ........................................ 2000-124757

(51) Int. Cl.⁷ ................................................ H03F 3/45
(52) U.S. Cl. ............................ 330/69; 330/75; 330/109
(58) Field of Search ............................ 330/69, 75, 109, 330/174, 85

(56) References Cited

U.S. PATENT DOCUMENTS

| | | | | |
|---|---|---|---|---|
| 4,543,536 A | * | 9/1985 | Pederson | 330/85 |
| 5,371,472 A | * | 12/1994 | Wohlstreicher | 330/109 |
| 6,104,120 A | | 8/2000 | Yamashita | 310/319 |
| 6,246,287 B1 | * | 6/2001 | Yamashita | 330/69 |

FOREIGN PATENT DOCUMENTS

JP 08-338781 12/1996
JP 11-242048 9/1999

OTHER PUBLICATIONS

Patent Abstracts of Japan, vol. 1999, No. 14, Dec. 22, 1999 & JP 11-242048 a (Murata Mfg. Co. Ltd.), Sep. 7, 1999 *abstract* & US 6,104120 A (Yamashita Muneharu), Aug. 15, 2000.

* cited by examiner

*Primary Examiner*—Robert Pascal
*Assistant Examiner*—Khanh V. Nguyen
(74) *Attorney, Agent, or Firm*—Ostrolenk, Faber, Gerb & Soffen, LLP (57) ABSTRACT

A charge-type sensor amplifying circuit includes an operational amplifier having an inverting input terminal thereof connected to one terminal of a charge-type sensor, a voltage divider having two voltage-dividing points which divide the output voltage from the operational amplifier, a feedback resistor connected between the inverting input terminal of the operational amplifier and one voltage-dividing point of the voltage divider which is on the output terminal side of the operational amplifier, and a feedback capacitor connected in parallel with the feedback resistor. In the charge-type sensor amplifying circuit, the other terminal of the charge-type sensor is connected to the other voltage-dividing point of the voltage divider which is not on the output terminal side of the operational amplifier.

4 Claims, 5 Drawing Sheets

CHARGE-TYPE SENSOR AMPLIFYING CIRCUIT

BACKGROUND OF THE INVENTION

1. Field of the Invention

The present invention relates to a charge-type sensor amplifying circuit for amplifying and outputting the output from a charge-type sensor such as an acceleration sensor.

2. Description of the Related Art

Hitherto, piezoelectric-type acceleration sensing devices, pyroelectric-type infrared sensing devices, and the like have been known as sensing devices that use sensors obtaining the detected outputs in the form of charges. Since the amount of charge which is generated when these sensing devices respond to acceleration, infrared, or the like is minute, e.g. 0.01 to several thousands pC, an amplifying circuit for amplifying the output from the sensor and obtaining the output in the form of a voltage signal is used. The piezoelectric acceleration sensing device is used for sensing activation of an airbag in a vehicle (collision detection), sensing the angular velocity while the vehicle is in motion, sensing a shock against a hard disk drive, and the like.

Figure 7:
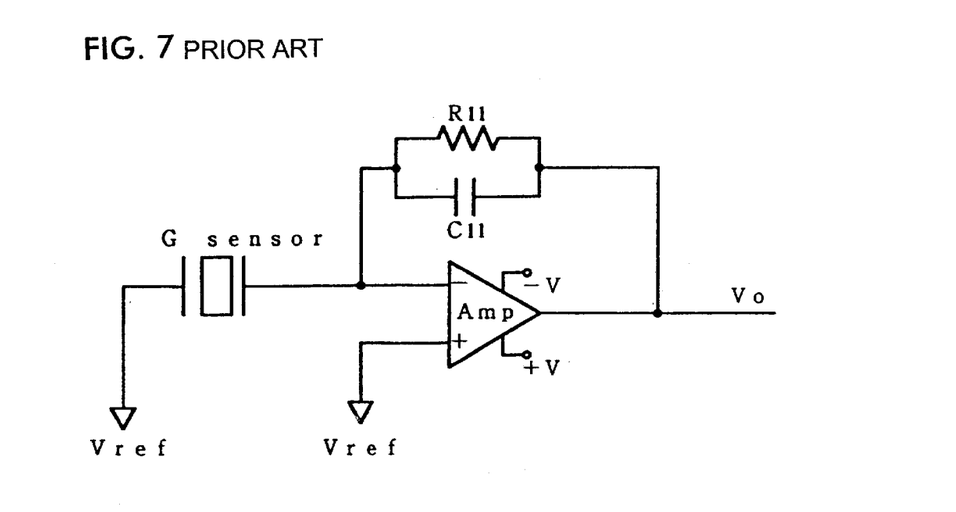
FIG. 7 is a block diagram showing the construction of another conventional acceleration sensor amplifying circuit.

A known amplifying circuit amplified the output from the sensor using a charge amplifier (Japanese Unexamined Patent Application Publication No. 8-338781). FIG. 7 shows the construction of the amplifying circuit disclosed in the application. In this amplifying circuit, a resistor (feedback resistor) $R_{11}$ is connected between an inverting input terminal and an output terminal of an operational amplifier Amp. A capacitor (feedback capacitor) $C_{11}$ is connected in parallel with this resistor $R_{11}$. One end of an acceleration sensor G is connected to the inverting input terminal of the operational amplifier and the other end of the acceleration sensor G is connected to a reference voltage $V_{ref}$. A non-inverting input terminal of the operational amplifier is connected to the reference voltage $V_{ref}$.

In this amplifying circuit, vibration is applied to the acceleration sensor in which charge Q is generated in accordance with the magnitudes of the acceleration and vibration, and the generated charge Q is amplified and output using the operational amplifier. The relationship between the charge Q generated at the acceleration sensor and the output voltage $V_o$ from the operational amplifier is given by $$V_0(s) = -sQ \times \frac{R_{11}}{1 + sC_{11}R_{11}} \quad \text{[equation 13]}$$

$V_0$ (s) is a Laplace transform function and is an algebraic equation with respect to s.

The frequency characteristic of this circuit is generally expressed by the output voltage and the cut-off frequency in a flat region. The cut-off frequency $f_c$ is given by $$fc = \frac{1}{2\pi C_{11}R_{11}} \quad \text{[equation 14]}$$

In order to expand the sensitivities of acceleration and vibration, the cut-off frequency $f_c$ should be decreased. As is obvious from the above [equation 14], when the capacitance of the capacitor $C_{11}$ and the resistance of the resistor $R_{11}$ are increased, the cut-off frequency $f_c$ is decreased. Therefore, the capacitance of the capacitor $C_{11}$ and the resistance of the resistor $R_{11}$ should be increased in order to increase sensitivity ranges of acceleration and vibration.

However, when the capacitance of the capacitor $C_{11}$ is increased, the following problems occur: the circuit behavior becomes unstable, which tends to cause oscillation; and, in addition, since the output voltage in the flat region is decreased, the sensitivity is decreased. Furthermore, there is another problem in that, since a resistance element having high resistance is expensive, when the high-resistance resistance element is used as the resistor $R_{11}$, the cost of the amplifying circuit is increased. Here, the sensitivity means the gain of the operational amplifier.

Figure 6:
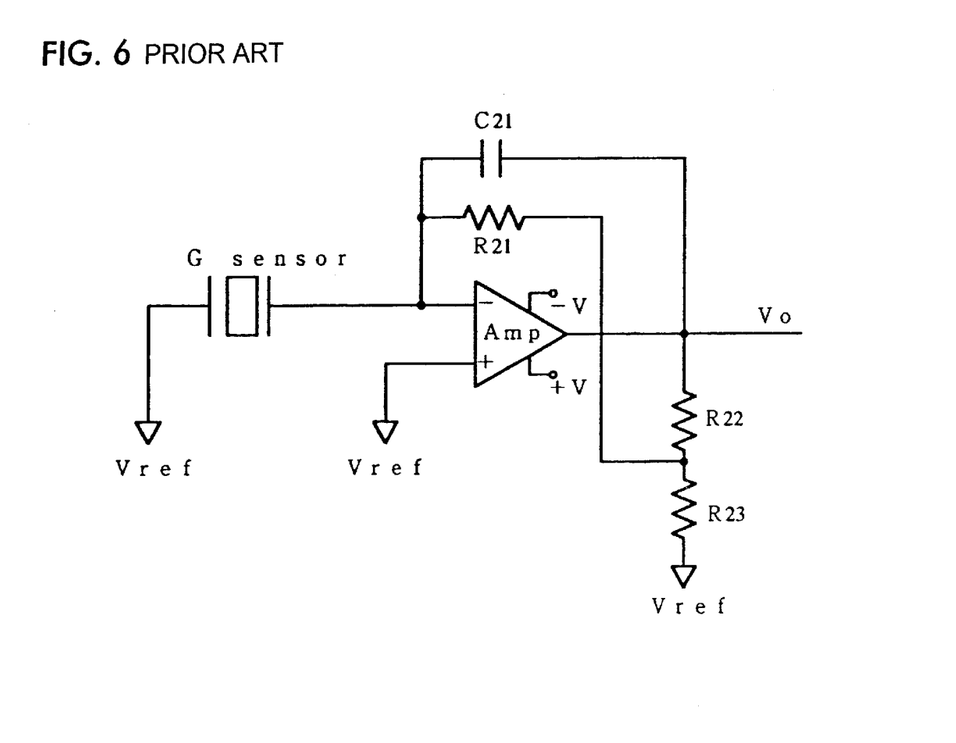
FIG. 6 is a block diagram showing the construction of a conventional acceleration sensor amplifying circuit.

The amplifying circuit for solving the foregoing problems is already disclosed in Japanese Unexamined Patent Application Publication No. 11-242048. FIG. 6 shows the construction of a piezoelectric-type sensor amplifying circuit that is disclosed in the application. In this piezoelectric-type sensor amplifying circuit, a capacitor $C_{21}$ is connected between the inverting input terminal and the output terminal of the operational amplifier Amp. Two resistors, $R_{22}$ and $R_{23}$ (function as dividing resistors) are connected in series in this order between the output terminal of the operational amplifier and the reference voltage $V_{ref}$. One terminal of the resistor $R_{21}$ is connected to a node between the resistors $R_{22}$ and $R_{23}$ and the other terminal of the resistor $R_{21}$ is connected to the inverting input terminal of the operational amplifier. The non-inverting input terminal of the operational amplifier is connected to the reference voltage. One terminal of the acceleration sensor G sensor is connected to the inverting input terminal of the operational amplifier and the other terminal thereof is connected to the reference voltage $V_{ref}$.

In the above amplifying circuit as well, vibration is applied to the acceleration sensor in which charge Q is generated in accordance with the magnitudes of the acceleration and vibration, and the generated charge Q is amplified and output using the operational amplifier. The relationship between the charge Q generated at the acceleration sensor and the output voltage $V_o$ from the operational amplifier is given by $$V_0(s) = -sQ \times \frac{\left(\frac{R_{21}R_{22} + R_{21}R_{23} + R_{22}R_{23}}{R_{23}}\right)}{1 + sC_{21}\left(\frac{R_{21}R_{22} + R_{21}R_{23} + R_{22}R_{23}}{R_{23}}\right)} \quad \text{[equation 15]}$$

$V_0$ (s) is a Laplace transform function in the same manner as the above [equation 13] and is an algebraic equation with respect to s. The cut-off frequency $f_c$ given by $$fc = \frac{1}{2\pi C_{21}\left(\frac{R_{21}R_{22} + R_{21}R_{23} + R_{22}R_{23}}{R_{23}}\right)} \quad \text{[equation 16]}$$

$$= \frac{1}{2\pi C_{21}R_{21}\left(1 + \frac{R_{22}}{R_{23}} + \frac{R_{22}}{R_{21}}\right)}$$

As is obvious from the above [equation 16], the cut-off frequency $f_c$ of the amplifying circuit shown in this FIG. 7 is one part in $(1 + R_{22}/R_{23} + R_{22}/R_{21})$ of that of circuit shown in FIG. 6. By adjusting the resistances of the resistors $R_{21}$ to $R_{23}$, the cut-off frequency $f_c$ can be decreased without decreasing the sensitivity (the sensitivity range can be expanded).

However, the amplifying circuits shown in the above FIGS. 6 and 7 did not compensate for the temperature characteristic of the charge sensitivity (the temperature characteristic of the amount Q of charge which is generated at the time of responding to acceleration, an infrared, or the like) of a piezoelectric sensor such as an acceleration sensor. Accordingly, there is a problem in that change in the output voltage Vo from an operational amplifier is considerable with respect to variation in the temperature.

Theoretically, when a feedback capacitor $C_{11}$ (or $C_{21}$), whose temperature characteristic is the same as the temperature characteristic of the charge sensitivity of the piezoelectric sensor is used, the fluctuation in the output voltage Vo from the operational amplifier with respect to the variation in the temperature can be prevented. This enables a temperature-compensated piezoelectric-type sensor amplifying circuit to be obtained. However, since it is difficult to obtain the piezoelectric sensor and the feedback capacitor that have the same temperature characteristic, implementation of the temperature-compensated piezoelectric-type senor amplifying circuit is difficult.

SUMMARY OF THE INVENTION

Accordingly, it is an object of this invention is to provide a charge-type sensor amplifying circuit to prevent the change in the output from the circuit with respect to the variation in the temperature in the circuit.

To this end, according to a first aspect of the present invention, there is provided a charge-type sensor amplifying circuit including an operational amplifier having an inverting input terminal thereof connected to a terminal of a charge-type sensor, a voltage divider having two voltage-dividing points which divide the output voltage from the operational amplifier, a feedback resistor connected between the inverting input terminal of the operational amplifier and one voltage-dividing point of the voltage divider which is on the output terminal side of the operational amplifier, and a feedback capacitor connected in parallel with the feedback resistor. In the charge-type sensor amplifying circuit, the other terminal of the charge-type sensor is connected to the other voltage-dividing point of the voltage divider which is not on the output terminal side of the operational amplifier.

Figure 1:
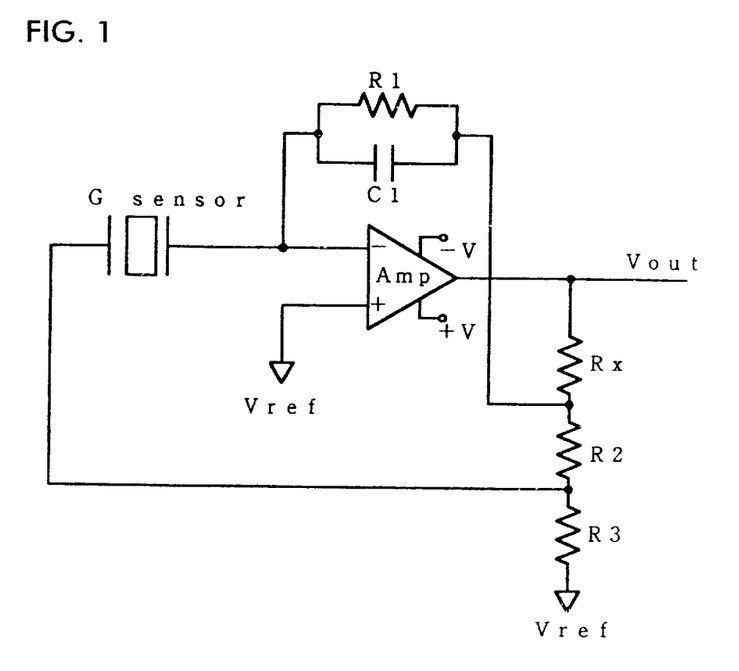
FIG. 1 is a block diagram showing the construction of an acceleration sensor amplifying circuit according to an embodiment of the present invention.

FIG. 1 is a circuit diagram of the charge-type sensor amplifying circuit according to the first aspect of the present invention. In FIG. 1, resistors $R_x$, $R_2$, and $R_3$ correspond to the voltage divider in this invention. A node between the resistor $R_x$ and $R_2$ corresponds to one voltage-dividing point of the voltage divider which is on the output terminal side of the operational amplifier. A node between the resistor $R_2$ and $R_3$ corresponds to the other voltage-dividing point of the voltage divider which is not on the output terminal side of the operational amplifier. In this circuit, temperature characteristic of the electric charge sensitivity in the piezoelectric sensor (in the drawing, the acceleration sensor G sensor) is represented as $d_{tc}$.

$$dtc = \frac{C_1}{C_1 + \alpha \times C_0} \times C_{1tc} + \frac{\alpha \times C_0}{C_1 + \alpha \times C_0} \times C_{0tc} \quad \text{[equation 1]}$$

where
$\alpha = R_3/(R_2+R_3)$
$C_0$: the capacitance of the acceleration sensor;
$C_{0tc}$: temperature characteristic of the capacitance in the acceleration sensor;
$C_{1tc}$: temperature characteristic of the capacitance in the feedback capacitor; and
$C_1$: the capacitance of the feedback capacitor.

When the circuit constants are satisfied with [equation 1], change in the output voltage $V_{out}$ from the operational amplifier with respect to variation in the temperature can be prevented. The reason for this is described below in detail. Therefore, by setting the circuit constants so that this [equation 1] is satisfied, temperature-compensated charge-type sensor amplifying circuit can be obtained. Thus, the charge-type sensor amplifying circuit in which the temperature compensation is achieved by means of a simple method such as setting circuit constants can be obtained.

The above [equation 1] does not include the resistance of the resistor $R_x$. Furthermore, as described below, the circuit gain varies in accordance with the resistance of the resistor $R_x$. Therefore, the sensitivity (the gain of the operational amplifier Amp) can be adjusted using the resistor $R_x$ without affecting the temperature compensation. The resistor $R_x$ functions as a sensitivity adjusting resistor.

According to a second aspect of the present invention, a charge-type sensor amplifying circuit includes an operational amplifier having an inverting input terminal thereof connected to a terminal of a charge-type sensor, a voltage divider having a voltage-dividing point which divides the output voltage from the operational amplifier, a feedback resistor connected between the inverting input terminal of the operational amplifier and the output terminal side of the operational amplifier, and a feedback capacitor connected in parallel with the feedback resistor. In the charge-type sensor amplifying circuit, the other terminal of the charge-type sensor is connected to the voltage-dividing point of the voltage divider.

Figure 2:
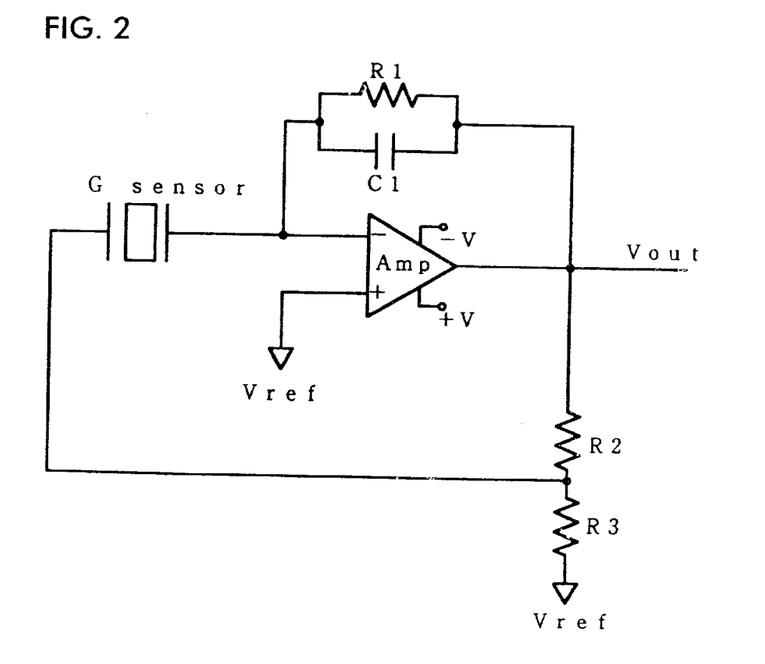
FIG. 2 is a block diagram showing the construction of the acceleration sensor amplifying circuit according to another embodiment of the present invention.

Next, FIG. 2 is the circuit diagram of the charge-type sensor amplifying circuit according to the second aspect of the present invention. This charge-type sensor amplifying circuit is a circuit obtained by setting the resistance of the resistor $R_x$ shown in FIG. 1 to 0 (the circuit without the resistor $R_x$). Therefore, as described in the first aspect of the present invention, by setting the circuit constants so that [equation 1] is satisfied, the temperature-compensated charge-type sensor amplifying circuit is obtained.

According to a third aspect of the present invention, a charge-type sensor amplifying circuit includes an operational amplifier having an inverting input terminal thereof connected to a terminal of a charge-type sensor, a voltage divider having a voltage-dividing point which divides the output voltage from the operational amplifier, a feedback resistor connected between the inverting input terminal of the operational amplifier and the voltage-dividing point of the voltage divider, and a feedback capacitor connected in parallel with the feedback resistor. In the charge-type sensor amplifying circuit, the other terminal of the charge-type sensor is connected to the voltage-dividing point of the voltage divider.

Figure 3:
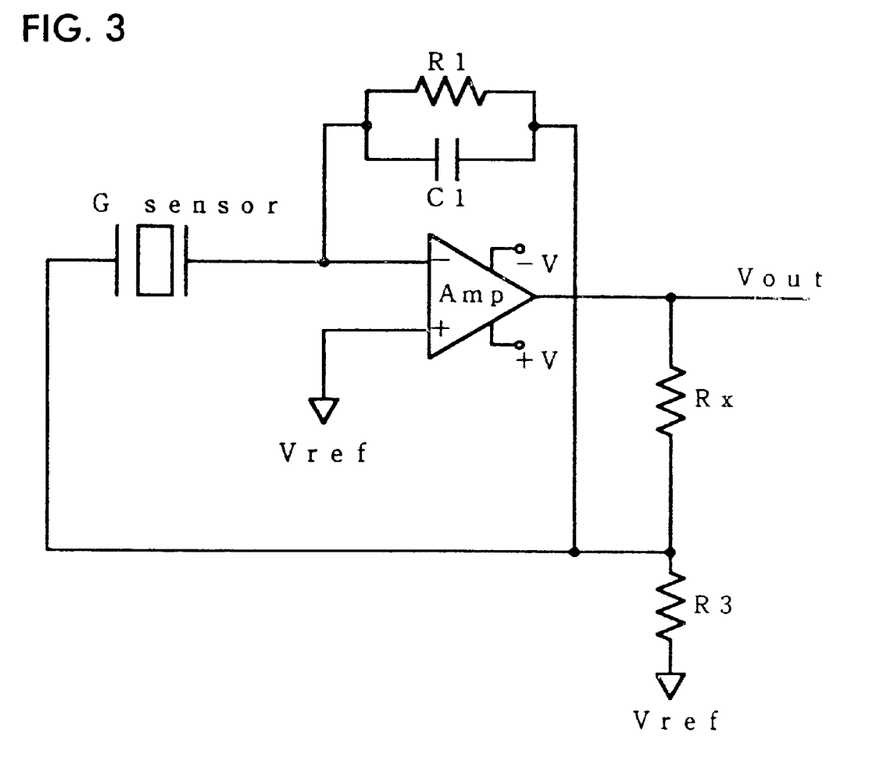
FIG. 3 is a block diagram showing the construction of the acceleration sensor amplifying circuit according to still another embodiment of the present invention.

FIG. 3 is a circuit diagram of the charge-type sensor amplifying circuit according to the third aspect of the present invention. This charge-type sensor amplifying circuit is a circuit obtained by setting the resistance of the resistor $R_2$ shown in FIG. 1 to 0 (the circuit without the resistor $R_2$).

$$d_{tc} = \frac{C_1}{C_1 + C_0} \times C_{1tc} + \frac{C_0}{C_1 + C_0} \times C_{0tc} \quad \text{[equation 2]}$$

where
$C_0$: the capacitance of the acceleration sensor;
$C_{0tc}$: the capacitance temperature characteristic of the acceleration sensor;

$C_{1tc}$: the capacitance temperature characteristic of the feedback capacitor; and $C_1$: the capacitance of the feedback capacitor.

Accordingly, when the circuit constants are satisfied with [equation 2] obtained by setting $R_2=0$ in the above [equation 1], the change in the output voltage $V_{out}$ from the operational amplifier with respect to the variation in the temperature can be prevented. Therefore, by setting the circuit constants so that this [equation 2] is satisfied, the temperature-compensated charge-type sensor amplifying circuit can be obtained.

In the charge-type sensor amplifying circuit, the feedback capacitor may include a capacitor whose temperature stability is high.

Since this construction is made so that a capacitor having a preferable temperature characteristic such as a ceramic capacitor or a film capacitor is used as the feedback capacitor $C_1$, the temperature characteristic $C_{1tc}$ of the feedback capacitor $C_1$ in each of the above [equation 1] and [equation 2] is negligible. Therefore, when the circuit construction is arranged according to the first aspect or the second aspect of the present invention, $$d_{tc} = \frac{\alpha \times C_0}{C_1 + \alpha \times C_0} \times C_{0tc} \qquad \text{[equation 3]}$$

where $\alpha = R_3/(R_2+R_3)$ $C_0$: the capacitance of the acceleration sensor;

$C_{0tc}$: the capacitance temperature characteristic of the acceleration sensor;

$C_{1tc}$: the capacitance temperature characteristic of the feedback capacitor; and $C_1$: the capacitance of the feedback capacitor.

When the circuit construction is arranged according to the third aspect of the present invention, $$d_{tc} = \frac{C_0}{C_1 + C_0} \times C_{0tc} \qquad \text{[equation 4]}$$

where $C_0$: the capacitance of the acceleration sensor;

$C_{0tc}$: the capacitance temperature characteristic of the acceleration sensor;

$C_{1tc}$: the capacitance temperature characteristic of the feedback capacitor; and $C_1$: the capacitance of the feedback capacitor.

By setting the circuit constants so that the corresponding expression is satisfied, the temperature-compensated charge-type sensor amplifying circuit can be obtained.

Furthermore, since the circuit that causes the output voltage from the operational amplifier to affect the capacitance of a piezoelectric-type sensor is constructed, a positive correlation between the charge sensitivity and the capacitance can be applied to the output voltage from the operational amplifier. This can prevent the variation in the output voltage from the operational amplifier.

DESCRIPTION OF THE PREFERRED EMBODIMENTS

The following is described concerning the embodiments of acceleration sensor amplifying circuit according to the embodiments of this invention. In the following description, electronic components, particularly, resistors and capacitors may be each replaced with a construction obtained by electrically establishing connections among a plurality of electronic components so that desirable electrical characteristics can be obtained.

FIG. 1 is a circuit diagram showing the acceleration sensor amplifying circuit according to an embodiment of this invention. In the acceleration sensor amplifying circuit according to this embodiment, an inverting input terminal of an operational amplifier Amp is connected to one terminal of an acceleration sensor G sensor. Three resistors $R_x$, $R_2$, and $R_3$ are connected in this order between an output terminal of this operational amplifier Amp and a reference voltage $V_{ref}$. In addition, one node between a feedback resistor $R_1$ and a feedback capacitor $C_1$ connected in parallel with each other is connected to the inverting input terminal of this operational amplifier Amp and the other node between the feedback resistor $R_1$ and the feedback capacitor $C_1$ connected in parallel with each other is connected to the node between the resistors $R_x$ and $R_2$. A non-inverting input terminal of the operational amplifier is connected to the above reference voltage $V_{ref}$ and the other terminal of the acceleration sensor G sensor is connected to the node between the above resistors $R_2$ and $R_3$. A driving power supply voltage $\pm V$ is applied to the operational amplifier.

In the following description, the acceleration sensor G sensor has:

a capacitance of $C_0$ [pF];

a electric charge sensitivity of d [pC/G];

a capacitance temperature characteristic of $C_{0tc}$ [ppm/°C.]; and a electric charge sensitivity temperature characteristic of $d_{tc}$ [ppm/°C.].

The feedback capacitor $C_1$ has:

a capacitance of $C_1$ [pF]; and a capacitance temperature characteristic of $C_{1tc}$ [ppm/°C.].

The resistances of the resistors $R_1$, $R_2$, $R_3$, and $R_x$ are $R_1$, $R_2$, $R_3$, and $R_x$, respectively.

In the acceleration sensor amplifying circuit according to this embodiment, circuit constants are set with respect to a measurement band (the lower bound frequency $f_l$ and the upper bound frequency $f_h$) so that $f_l > 1/(2 \times \pi \times R_1 \times C_1)$, $f_h < 1/(2 \times \pi \times R_2 \times C_1)$, $f_h < 1/(2 \times \pi \times C_0 \times R_3)$, and $f_h < 1/(2 \times \pi \times C_1 \times R_x)$ are satisfied.

In the above measurement band ($f_1$ to $f_h$), the output voltage $V_{out}$ with respect to the acceleration 1G is given by $$\frac{V_{out}}{G} = -d \times \frac{1}{C_1 + \frac{R_3}{R_2+R_3} \times C_0} \times \left(1 + \frac{R_x}{R_1} + \frac{R_x}{R_2+R_3}\right) \quad \text{[equation 5]}$$

In this circuit, the acceleration sensor G sensor is connected to the node between the above resistors $R_2$ and $R_3$, as is obvious from [equation 5], so that the output voltage $V_{out}$ from the operational amplifier Amp is influenced by the capacitance $C_0$ of the acceleration sensor G sensor. Partial differentiation of [equation 5] with respect to a temperature T is given by $$\frac{1}{V_{out}} \frac{\partial V_{out}}{\partial T} = \frac{1}{d}\frac{\partial d}{\partial T} - \frac{1}{C_1 + \alpha \times C_0}\left(\frac{\partial C_1}{\partial T} + \alpha \times \frac{\partial C_0}{\partial T}\right) \quad \text{[equation 6]}$$

where $\alpha = R_3/(R_2+R_3)$.

Since the temperature characteristics of the resistors $R_1$ to $R_3$, and $R_x$ are substantially zero, they are negligible. By setting the temperature gradient ($\partial V_{out}/\partial T$) of the output voltage $V_{out}$ from the operational amplifier Amp to 0 in this [equation 6] (by setting the left-hand side value in [equation 6] to 0) and rearranging the expression, the following expression is obtained.

$$\frac{1}{d}\frac{\partial d}{\partial T} = \frac{C_1}{C_1 + \alpha \times C_0} \times \frac{1}{C_1}\frac{\partial C_1}{\partial T} + \frac{\alpha \times C_0}{C_1 + \alpha \times C_0} \times \frac{1}{C_0}\frac{\partial C_0}{\partial T} \quad \text{[equation 7]}$$

where $\alpha = R_3/(R_2+R_3)$.

Here, $(1/d) \times (\partial d/\partial T)$, $(1/C_1) \times (\partial C_1/\partial T)$, and $(1/C_0) \times (\partial C_0/\partial T)$ of this [equation 7] are the electric charge sensitivity temperature gradient ($d_{tc}$) of the acceleration sensor G, the capacitance temperature gradient ($C_{1tc}$) of the feedback capacitor $C_1$, and the capacitance temperature gradient ($C_{0tc}$) of the acceleration sensor, respectively.

By rearranging and rewriting the above [equation 7], the following expression is obtained.

$$d_{tc} = \frac{C_1}{C_1 + \alpha \times C_0} \times C_{1tc} + \frac{\alpha \times C_0}{C_1 + \alpha \times C_0} \times C_{0tc} \quad \text{[equation 8]}$$

where $\alpha = R_3/(R_2+R_3)$.

[equation 8] is identical to [equation 1]. Since, as described above, [equation 8] is obtained by setting the temperature characteristic of the output voltage from the operational amplifier Amp to 0, when the circuit constants are set so that [equation 8] is satisfied, the acceleration sensor amplifying circuit having the temperature gradient of the output voltage $V_{out}$ from the operational amplifier Amp of 0, in other words, achieving temperature compensation can be obtained.

To be specific, the acceleration sensor G sensor and the feedback capacitor $C_1$ are set, and then the resistances of the resistors $R_2$ and $R_3$ are set so that the above [equation 8] is satisfied. Because of this, the acceleration sensor amplifying circuit which prevents the change in the output voltage $V_{out}$ from the operational amplifier Amp with respect to the variation in the temperature, namely, the temperature-compensated acceleration sensor amplifying circuit can be obtained. In addition, since the acceleration sensor G and the feedback capacitor $C_1$ can be selected without paying much attention to the characteristics thereof, inexpensive components can be used, turning out to achieve a cost-saving effect.

Since the resistor $R_x$ functions as the feedback resistor of the operational amplifier Amp and does not influence [equation 8], the sensitivity adjustment (adjustment of the gain of the operational amplifier Amp) can be performed without influencing the temperature compensation by adjusting the resistance of the resistor $R_x$.

There is the positive correlation between the charge sensitivity and the capacitance of the piezoelectric body. The acceleration sensor amplifying circuit according to this embodiment is a circuit in which, as described above, the capacitance of the acceleration sensor G sensor influences the output voltage $V_{out}$ from the above operational amplifier Amp. Therefore, the positive correlation between the electric charge sensitivity and the capacitance of the acceleration sensor G sensor acts on the output voltage $V_{out}$ from the operational amplifier Amp, the fluctuation of the output voltage $V_{out}$ from the operational amplifier Amp is prevented.

Use of a capacitor such as the ceramic capacitor or the film capacitor having a preferable temperature characteristic enables the temperature gradient ($C_{1tc}$) of the feedback capacitor $C_1$ in the above [equation 8] to be negligible. By setting $C_{1tc} = 0$ in the above [equation 8], $$d_{tc} = \frac{\alpha \times C_0}{C_1 + \alpha \times C_0} \times C_{0tc} \quad \text{[equation 9]}$$

where $\alpha = R_3/(R_2+R_3)$.

When the circuit constants are set so that [equation 9] is satisfied, the temperature-compensated acceleration sensor amplifying circuit whose temperature gradient of the output voltage $V_{out}$ is zero can be obtained.

Furthermore, since the capacitor such as the ceramic capacitor or film capacitor having a preferable temperature characteristic is inexpensive and easy to be obtained, the highly-versatile and low-cost circuit can be implemented.

The inventor of the present invention considers, as the circuit constants which are satisfied with [equation 8] or [equation 9], the circuit constants which cause the right-hand side value of [equation 8] or [equation 9] to be as close as the left-hand side value thereof by within ±15%, more preferably, ±10%. This is consideration based on the following measurement results (verified results).

Here, the measurement results are described obtained by measuring the rate of change in the output voltage $V_{out}$ with respect to the variation in the temperature of the acceleration sensor amplifying circuit shown in FIG. 1. The circuit constants are described as follows.

The acceleration sensor (G sensor) has:

a capacitance of $C_0 = 170$ [pF];

a charge sensitivity of $d = 0.17$ [pC/G];

a capacitance temperature characteristic of $C_{0tc} = 2622$ [ppm/°C.]; and a charge sensitivity temperature characteristic of $d_{tc} = 1456$ [ppm/°C.].

The resistors $R_1$ to $R_3$ and $R_x$ are thick-film chip resistors using metal oxide, and the resistances thereof are as follow:

$R_1 = 10$ MΩ;

$R_2 = 360$ Ω;

$R_3 = 1$ kΩ; and $R_x = 10$ kΩ.

The feedback capacitor $C_1$ is the ceramic capacitor whose temperature characteristic is negligible and has:

a capacitance $C_1$ of 100 [pF]; and a capacitance temperature characteristic of $C_{1tc}$ of 0 [ppm/°C.].

In this circuit, [equation 9] shows that:

the left-hand side=1456.0, and the right-hand side=1456.7, which means that the right-hand side value is greater than the left-hand side value by approximately 0.05% (the left-hand side and the right-hand side are substantially equal).

The acceleration sensor amplifying circuit obtained by replacing only the resistor $R_2$ with a resistor having a resistance of 750Ω was also measured. In this circuit, [equation 9] shows that:

the left-hand side=1456.0, and the right-hand side=1292, which means that the right-hand side value is less than the left-hand side value by approximately 11%.

Figure 4:
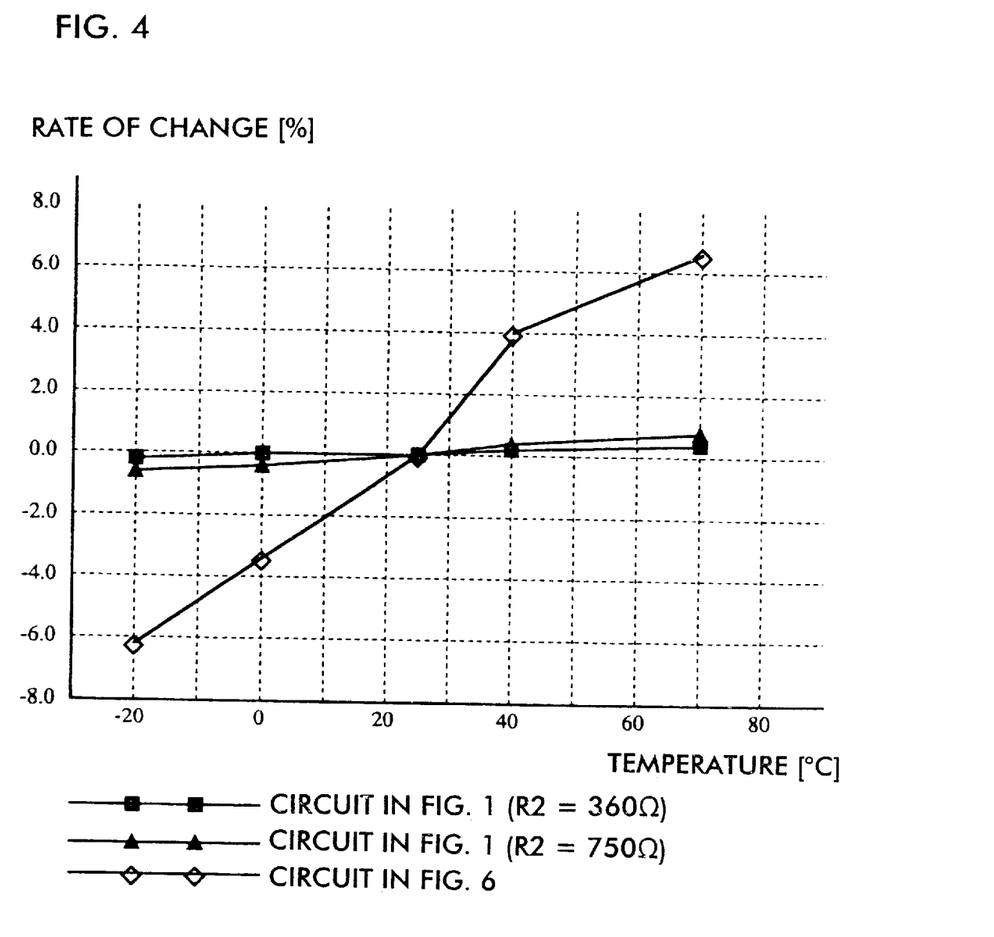
FIG. 4 is a graph showing temperature characteristics of the acceleration sensor amplifying circuits according to the embodiment of the present invention.

FIG. 4 shows rates of change in the output voltage $V_{out}$ from the operational amplifier Amp with respect to the temperature variation in these acceleration sensor amplifying circuits. For comparison, FIG. 4 also shows the rate of change in the output voltage $V_{out}$ from the operational amplifier Amp with respect to the temperature variation in a conventional acceleration sensor amplifying circuit shown in FIG. 6. In FIG. 4, the horizontal axis represents the temperature and the vertical axis represents the rate of change in the output voltage $V_{out}$ from the operational amplifier Amp. In the figure, the rate of change in the output voltage $V_{out}$ with respect to the temperature variation is shown by setting the output voltage $V_{out}$ at a temperature of 25°C. as a reference. This figure clearly demonstrates that the conventional circuit shown in FIG. 6 is a circuit with no temperature compensation because the rate of change in the output voltage $V_{out}$ from the conventional circuit is considerable compared to the temperature variation in the conventional circuit. On the other hand, the rate of change in the output voltage $V_{out}$ from the acceleration sensor amplifying circuit according to this embodiment with respect to the temperature variation is substantially zero. In the circuit obtained by replacing the resistor $R_2$ with a resistor having a resistance of 750Ω, the change in the output voltage $V_{out}$ with respect to the temperature variation is substantially prevented. Therefore, when the right-hand side value is as close as the left-hand side value by within ±11%, the circuit constants may be said to be satisfied with [equation 8] or [equation 9].

Next, another embodiment according to this invention is described. The acceleration sensor amplifying circuit according to this embodiment has a construction of the circuit shown in FIG. 1 in which the resistance of the resistor $R_x$ is set to 0 ($R_x$ is removed) (see FIG. 2). Since, as described above, the resistor $R_x$ does not influence the temperature compensation, the acceleration sensor amplifying circuit according to this embodiment achieves substantially the same effect as in the foregoing embodiment. In addition, removal of the resistor $R_x$ leads to simplification of the circuit construction.

As described above, by appropriately setting the circuit constants of the acceleration sensor amplifying circuits shown in FIGS. 1 and 2 (by setting them so that [equation 8] or [equation 9] is satisfied), the acceleration sensor amplifying circuit (the temperature-compensated acceleration sensor amplifying circuit) which prevents the fluctuation in the output voltage $V_{out}$ from the operational amplifier Amp with respect to the temperature change can be obtained.

In addition, still another embodiment according to this invention is described. The acceleration sensor amplifying circuit has a construction of the circuit shown in FIG. 1 in which the resistance of the resistor $R_2$ is set to 0 (the resistor $R_2$ is removed) (see FIG. 3).

The circuit constants of the acceleration sensor amplifying circuit according to this embodiment are set with respect to a measurement band (the lower bound frequency $f_l$ and the upper bound frequency $f_h$) so that: these $f_l > 1/(2 \times \pi \times R_1 \times C_1)$, $f_h < 1/(2 \times \pi \times C_0 \times R_3)$, and $f_h < 1/(2 \times \pi \times C_1 \times R_x)$ are satisfied.

In the above measurement band ($f_l$ to $f_h$), the output voltage $V_{out}$ with respect to the acceleration 1G is given by $$\frac{V_{out}}{G} = -d \times \frac{1}{C_1 + C_0} \times \left(1 + \frac{Rx}{R_1} + \frac{Rx}{R_3}\right) \quad \text{[equation 10]}$$

In the acceleration sensor amplifying circuit according to this embodiment as well, the acceleration sensor G sensor is connected to the node between the above resistor $R_x$ and the resistor $R_3$, as is obvious from [equation 10], so that the capacitance $C_0$ of the acceleration sensor G sensor influences the output voltage $V_{out}$ from the operational amplifier Amp. Since the circuit according to this embodiment is the one according to the above embodiment without the resistor $R_2$, the following is obtained by setting $R_2=0$ in the above [equation 8].

$$d_{tc} = \frac{C_1}{C_1 + C_0} \times C_{1tc} + \frac{C_0}{C_1 + C_0} \times C_{0tc} \quad \text{[equation 11]}$$

By setting the circuit constants so that [equation 11] is satisfied, the change in the output voltage $V_{out}$ from the operational amplifier Amp with respect to the variation in the temperature can be prevented. Thus, the temperature-compensated acceleration sensor amplifying circuit can be obtained.

Since the resistor $R_x$ functions as the feedback resistor of the operational amplifier Amp and it is an electronic component that does not influence the above [equation 11], the sensitivity adjustment can be performed without affecting the above temperature compensation by adjusting the resistance of the resistor $R_x$.

In addition, there is the positive correlation between the charge sensitivity and the capacitance of the piezoelectric body. Since, as described above, the acceleration sensor amplifying circuit is the circuit in which the capacitance of the acceleration sensor G sensor influences the output voltage $V_{out}$ from the operational amplifier Amp, the positive correlation between the charge sensitivity and the capacitance of the above acceleration sensor G sensor is applied to the output voltage $V_{out}$ from the operational amplifier Amp. This can prevent the change in the output voltage $V_{out}$ from the operational amplifier Amp.

By using, as the feedback capacitor $C_1$, the capacitor having a preferable temperature characteristic such as the ceramic capacitor or the film capacitor, the temperature gradient ($C_{1tc}$) of the feedback capacitor in the above [equation 11] is negligible. Accordingly, by setting $C_{1tc}=0$ in the above [equation 11], $$d_{tc} = \frac{C_0}{C_1 + C_0} \times C_{0tc} \quad \text{[equation 12]}$$

By setting the circuit constants so that [equation 12] is satisfied, the acceleration sensor amplifying circuit having a temperature gradient of the output voltage $V_{out}$ of 0 and undergoing temperature compensation can be obtained.

To be specific, after the acceleration sensor G sensor is set, the capacitance of the feedback capacitor $C_1$ should be set so that the above [equation 12] is satisfied. The lower bound frequency $f_l$ of the measurement band of the acceleration sensor amplifying circuit can be adjusted by the resistance of the resistor $R_1$ and the sensitivity of the acceleration sensor amplifying circuit can be adjusted by the resistance of the resistor $R_x$. Furthermore, since the capacitor having a preferable temperature characteristic such as the ceramic capacitor or film capacitor is inexpensive and easy to be obtained, the highly-versatile and low-cost circuit can be implemented.

Therefore, in the acceleration sensor amplifying circuit according to this embodiment as well, the temperature compensation can be implemented by appropriately setting the circuit constants.

Here, in the acceleration sensor amplifying circuit shown in FIG. 1, the measurement results (verified result) of the rate of change in the output voltage with respect to the temperature change are described. The circuit constants are shown as follow.

The acceleration sensor (G sensor) has:

a capacitance of $C_0$=170 [pF];

a charge sensitivity of d=0.17 [pC/G];

a capacitance temperature characteristic of $C_{0tc}$=2622 [ppm/°C.]; and a charge sensitivity temperature sensitivity of $d_{tc=}$ 1456 [ppm/°C.].

The resistors $R_1$, $R_3$, and $R_x$ are thick-film chip resistors using metal oxide and the resistances thereof are as follow:

$R_1$=10 MΩ, $R_3$=1 kΩ, and $R_x$=10 kΩ.

The feedback capacitor $C_1$ is the ceramic capacitor whose temperature characteristic is negligible and has:

a capacitance of $C_1$=130 [pF]; and a capacitance temperature characteristic of $C_{1tc}$=0 [ppm/°C.].

In this circuit, [equation 12] shows that:

the left-hand side=1456 and the right-hand side=1485, which means that the right-hand side value is greater than the left-hand side value by approximately 2% (the left-hand side and the right-hand side are substantially equal).

The circuit obtained by replacing the feedback capacitor $C_1$ with a capacitor having a capacitance of 180 pF was measured. In this circuit, [equation 12] shows that:

the left-hand side=1456 and the right-hand side=1273, which means that the right-hand side value is less than the left-hand side value by approximately 14%.

Figure 5:
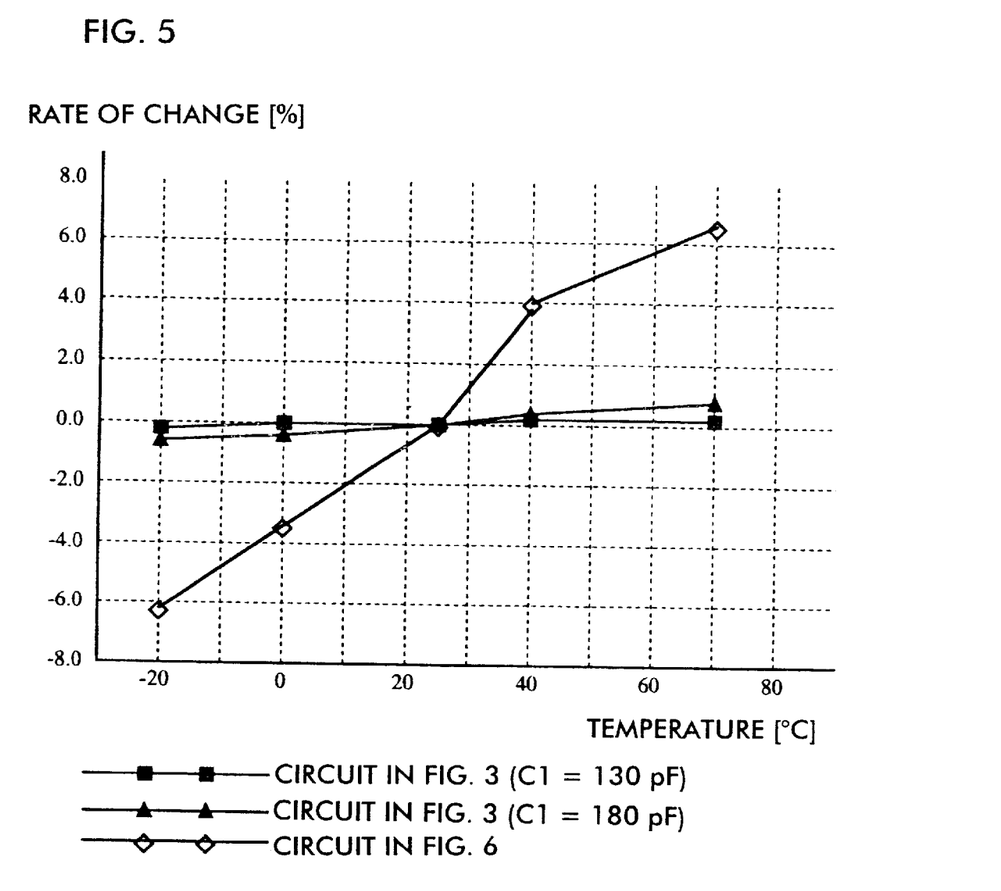
FIG. 5 is a graph showing temperature characteristics of the acceleration sensor amplifying circuits according to another embodiment of the present invention.

FIG. 5 shows rates of change in the output voltage $V_{out}$ from the operational amplifier Amp with respect to the variation in the temperature in these acceleration sensor amplifying circuits. For comparison, FIG. 5 also shows that the rate of change in the output voltage $V_{out}$ from the operational amplifier Amp with respect to the temperature variation in the conventional acceleration sensor amplifying circuit shown in FIG. 6. In FIG. 5, the horizontal axis represents temperature and the vertical axis represents the rate of change in the output voltage $V_{out}$ from the operational amplifier Amp. In this drawing, the rate of change in the output voltage $V_{out}$ with respect to temperature variation is shown by setting the output voltage $V_{out}$ at a temperature of 25° C. as the reference. As is obvious from this drawing, the conventional circuit shown in FIG. 6 is a circuit undergoing no temperature compensation because the rate of change in the output voltage $V_{out}$ is considerable with respect to the temperature variation. On the other hand, in the acceleration sensor amplifying circuit according to the present embodiment, the rate of change in the output voltage $V_{out}$ with respect to the temperature variation is substantially zero. In the circuit obtained by replacing the feedback capacitor $C_1$ with a capacitor having a capacitance of 180 pF, the change in the output voltage $V_{out}$ with respect to the temperature variation is substantially prevented. Therefore, when the right-hand side value is as close as the left-hand side value by within ±14%, the circuit constants may be said to be satisfied with [equation 12].

In the above embodiments, the present invention is described using an example of the acceleration sensor amplifying circuit which employs the acceleration sensor as the piezoelectric-type sensor. The present invention can be used as a piezoelectric-type sensor amplifying circuit employing another type of piezoelectric sensor such as a pyroelectric infrared sensor.

What is claimed is:

1. A charge-type sensor amplifying circuit comprising:

an operational amplifier having an inverting input terminal thereof connected to a first terminal of a charge-type sensor;

a voltage divider having first and second voltage-dividing points which divide an output voltage from said operational amplifier;

a feedback resistor connected between the inverting input terminal of said operational amplifier and the first voltage-dividing point of said voltage divider which is on an output terminal side of said operational amplifier; and a feedback capacitor connected in parallel with said feedback resistor;

wherein a second terminal of said charge-type sensor is connected to the second voltage-dividing point of said voltage divider which is not on the output terminal side of said operational amplifier.

2. A charge-type sensor amplifying circuit comprising:

an operational amplifier having an inverting input terminal thereof connected to a first terminal of a charge-type sensor;

a voltage divider having a voltage-dividing point which divides an output voltage from said operational amplifier;

a feedback resistor connected between the inverting input terminal of said operational amplifier and an output terminal side of said operational amplifier; and a feedback capacitor connected in parallel with said feedback resistor;

wherein a second terminal of said charge-type sensor is connected to the voltage-dividing point of said voltage divider.

3. A charge-type sensor amplifying circuit comprising:

an operational amplifier having an inverting input terminal thereof connected to a first terminal of a charge-type sensor;

a voltage divider having a voltage-dividing point which divides an output voltage from said operational amplifier;

a feedback resistor connected between the inverting input terminal of said operational amplifier and the voltage-dividing point of said voltage divider; and a feedback capacitor connected in parallel with said feedback resistor;

wherein the other terminal of said charge-type sensor is connected to the voltage-dividing point of said voltage divider.

4. A charge-type sensor amplifying circuit according to any one of claims 1 to 3, wherein said feedback capacitor includes a capacitor whose temperature stability is high.

* * * * *